（12) United States Patent
Huang

(10) Patent No.: US 7,110,313 B2
(45) Date of Patent: Sep. 19, 2006

(54) MULTIPLE-TIME ELECTRICAL FUSE PROGRAMMING CIRCUIT

(75) Inventor: Chien-Hua Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 11/028,839

(22) Filed: Jan. 4, 2005

(65) Prior Publication Data

US 2006/0152990 A1    Jul. 13, 2006

(51) Int. Cl.
*G11C 7/00* (2006.01)
*G11C 8/00* (2006.01)

(52) U.S. Cl. .............................. 365/225.7; 365/189.07; 365/189.08; 365/189.09

(58) Field of Classification Search ............. 365/225.7, 365/189.08, 189.07, 189.09, 189.05, 210
See application file for complete search history.

(56) References Cited

U.S. PATENT DOCUMENTS

| | | | | |
|---|---|---|---|---|
| 5,258,947 | A | * | 11/1993 | Sourgen ...................... 365/96 |
| 6,424,584 | B1 | * | 7/2002 | Seyyedy .................. 365/225.7 |
| 6,661,330 | B1 | | 12/2003 | Young |
| 6,710,640 | B1 | | 3/2004 | Kothandaraman et al. |
| 2002/0084508 | A1 | | 7/2002 | Le et al. |
| 2004/0056703 | A1 | | 3/2004 | Kothandaraman et al. |

* cited by examiner

*Primary Examiner*—Son T. Dinh
(74) *Attorney, Agent, or Firm*—Slater & Matsil, L.L.P.

(57) ABSTRACT

A multiple-time electrical fuse programming circuit is described. The circuit includes a programming counter to record the number of programmings, a blowing reference voltage generator to generate a blowing voltage reference wherein the fuse resistance after programming is determined by the blowing voltage reference, at least one self-controlled programmable fuses which includes a programmable fuse and a control circuit. The multiple-time electrical fuse programming circuit also has a fuse detection reference generator and a high voltage power source.

27 Claims, 10 Drawing Sheets

US 7,110,313 B2

MULTIPLE-TIME ELECTRICAL FUSE PROGRAMMING CIRCUIT

FIELD OF INVENTION

This invention relates generally to an electrical fuse and more particularly to an electrical fuse programming circuit.

BACKGROUND

In the semiconductor industry, fuse elements are a widely used feature in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. A fuse disconnected by a laser beam is referred to as a laser fuse, while a fuse disconnected by passing an electrical current, or blowing, is referred to as an electrical fuse, or e-fuse. By selectively blowing fuses within an integrated circuit, which has multiple potential uses, a generic integrated circuit design may be economically manufactured and adapted to a variety of custom uses.

Typically, fuses are incorporated in the design of the integrated circuit, wherein the fuses are selectively blown, for example, by passing an electrical current of a sufficient magnitude to cause the electromigration or melting, thereby creating a more resistive path or an open circuit. Alternatively, a current that is weaker than the current required to entirely blow the fuse can be applied to the fuse in order to degrade the fuse, thus increasing a resistance through the fuse. The process of selectively blowing or degrading fuses is often referred to as "programming".

Conventional circuits for programming a fuse are shown in FIGS. 1a and 1b, in which the fuse is connected between the drain of a programming transistor and a power supply node 100 or 120. Initially, the resistance of the fuse is small (in the range of 100 ohms). The fuse is programmed by switching on the programming transistor 106 or 122 with a high voltage $V_{prog}$ applied to the gate of the transistor 106 or a low voltage applied to the gate of the transistor 122. When the transistor is turned on, the transistor starts to conduct and current flows through the fuse 102 or 126. The current flow causes the fuse 102 or 126 to heat up, and if sufficient current continues to flows through it, it will get programmed, resulting in a much higher resistance. Blocks 110 and 130 are detection circuits to detect the fuse resistances.

The resistance of the electrical fuse always increases through programming. The fuse is programmed to a high resistance, either "open" or higher than a reference resistance. If state "0" is used to represent fuse's low resistance state and state "1" is used the represent the high resistance state, then the state of a programmable fuse can only change from "0" to "1" and the state can only be changed once. This limits the usage of programmable electrical fuse to a large extent. Therefore there is the need for a new fuse that can be programmed multiple times.

SUMMARY OF THE INVENTION

The preferred embodiment of the present invention is devised to provide a multiple time electrical fuse programming circuit. Multiple reference resistances are pre-determined by setting the blowing reference voltages on a voltage divider. An electrical fuse can be programmed so that its resistance is equal to one of the reference resistances. The state of a fuse is determined by comparing the fuse resistance with the reference resistances.

The multiple time electrical fuse programming circuit comprises programmable fuses to be programmed, a programming counter to record the number a fuse has been programmed, a blowing reference generator to provide a voltage that is used to program a fuse to the desired resistance, a fuse detection reference generator to provide a reference voltage, and a fuse state detection circuit to determine the state of a fuse.

DESCRIPTION OF DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 1A:
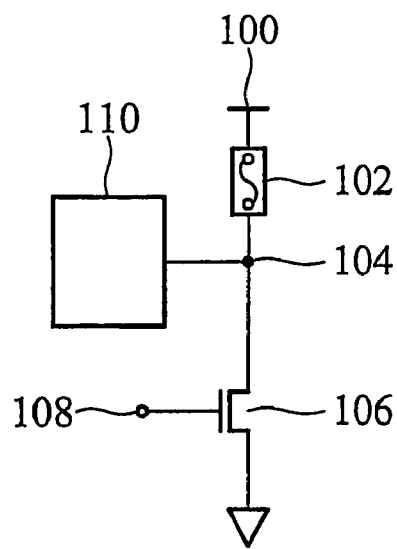
FIGS. 1a and 1b are conventional one time fuse programming circuits.
Figure 1B:
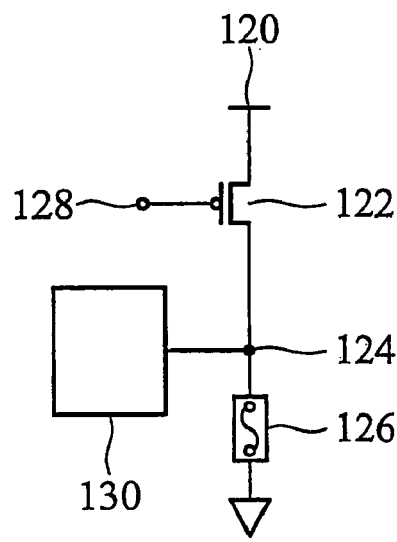

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The mechanism of a multiple-time electrical fuse programming circuit is discussed. Then a preferred embodiment is explained.

In the prior art, an electrical fuse can only be programmed once since the target resistance of a fuse is not controlled. The state of the fuse is determined by comparing its resistance to a reference resistance. The reference resistance is normally a fixed value or a range. The programming is performed in an uncontrolled manner in the sense that there is no special requirement except that the target resistance of the programmed fuse is higher than the reference resistance. In many situations, the fuse is programmed under a current for certain time. The programmed fuse may be completely open, or have a high resistance. The exact resistance value is not an issue as long as it is higher than the reference resistance.

The present invention uses multiple resistance references instead of one to determine the state of a fuse. A series of reference resistances ranging from low to high are pre-determined. When a fuse is programmed first time, its resistance is programmed identical (defined as being close enough to distinguish from the reference resistance) to the first reference resistance. A second time, the fuse resistance is programmed identical to the second reference resistance, and so on until all reference resistances have been used.

In order to make the description easier, some notions are used throughout the rest of the description. Subscripts are used to depict sequenced or parallel devices. Number n is used to represent the maximum times a fuse is programmed. Number k is used to represent the number of programmable fuses in the circuit. Symbol j is used to indicate a stage of the multiple programming, j=1 indicates the first programming and j=n indicates the nth programming. $R_{ref1}$, $R_{ref2}$, $R_{ref3}$ . . . . $R_{refn}$ are pre-determined reference resistances, $R_i$ is the initial resistance of a never programmed fuse, $R_b$ is the fuse resistance after the fuse is fully blown, and the reference resistances follow:

$$R_i < R_{ref1} < R_{ref2} < \ldots < R_{refn} < R_b \qquad [\text{Eq. 1}]$$

A blowing reference voltage $V_{BRF}$ is used to determine whether the fuse resistance reaches the reference resistance or not. The blowing reference voltage corresponding to a reference resistance $R_{refj}$ is $V_{BRFj}$. The state of a fuse is always relative to the reference resistance and it is defined as: if the resistance of a fuse is smaller than the reference resistance being used, the fuse is in a state "0", conversely, if the resistance of a fuse is equal to or higher than the reference resistance being used, the fuse is in a state "1".

Before the first programming, the fuse resistance is $R_i$ that is smaller than any of the reference resistances. The state of the fuse is "0" compared to all of the reference resistances. The fuse is then programmed and the programming process is controlled by a circuit so that the fuse resistance equals $R_{ref1}$, substantially accurately. After the first programming, the state of the fuse changes to "1" compared to $R_{ref1}$. Since current fuse resistance $R_{ref1}$ is still smaller than all of the $R_{ref2}$ through $R_{refn}$, the state of the fuse is "0" compared to $R_{ref2}$ through $R_{refn}$. The fuse is not programmable compared to $R_{ref1}$, but is still programmable compared to $R_{ref2}$ through $R_{refn}$. Using $R_{ref1}$ through $R_{refn}$, the fuse can be programmed up to n times.

It is to be noted that for each programming, care needs to be taken to not over program. An example of "over programming" is that after jth programming, the target resistance is equal to or higher than $R_{ref(j+1)}$ while it is supposed to be $R_{refj}$. To prevent "over programming" from occurring, the reference resistances should be separated far enough, and the programming current should be in a reasonable range. The details of these requirements are provided in subsequent paragraphs. The fuse used for multiple programming is similar to what is used for one time programming; the only requirement is that the change of the fuse resistance is controllable. While it is preferable that poly-silicide fuses are used since they are commonly used electrical fuses and their characteristics are known, other fuses with similar electrical-thermal characteristics can also be used. In an example, the initial resistance of a poly-silicide is about 100 ohms. After final programming, the resistance may reach about 3000 ohms. A fuse like this can be programmed at least three to four times.

Figure 2:
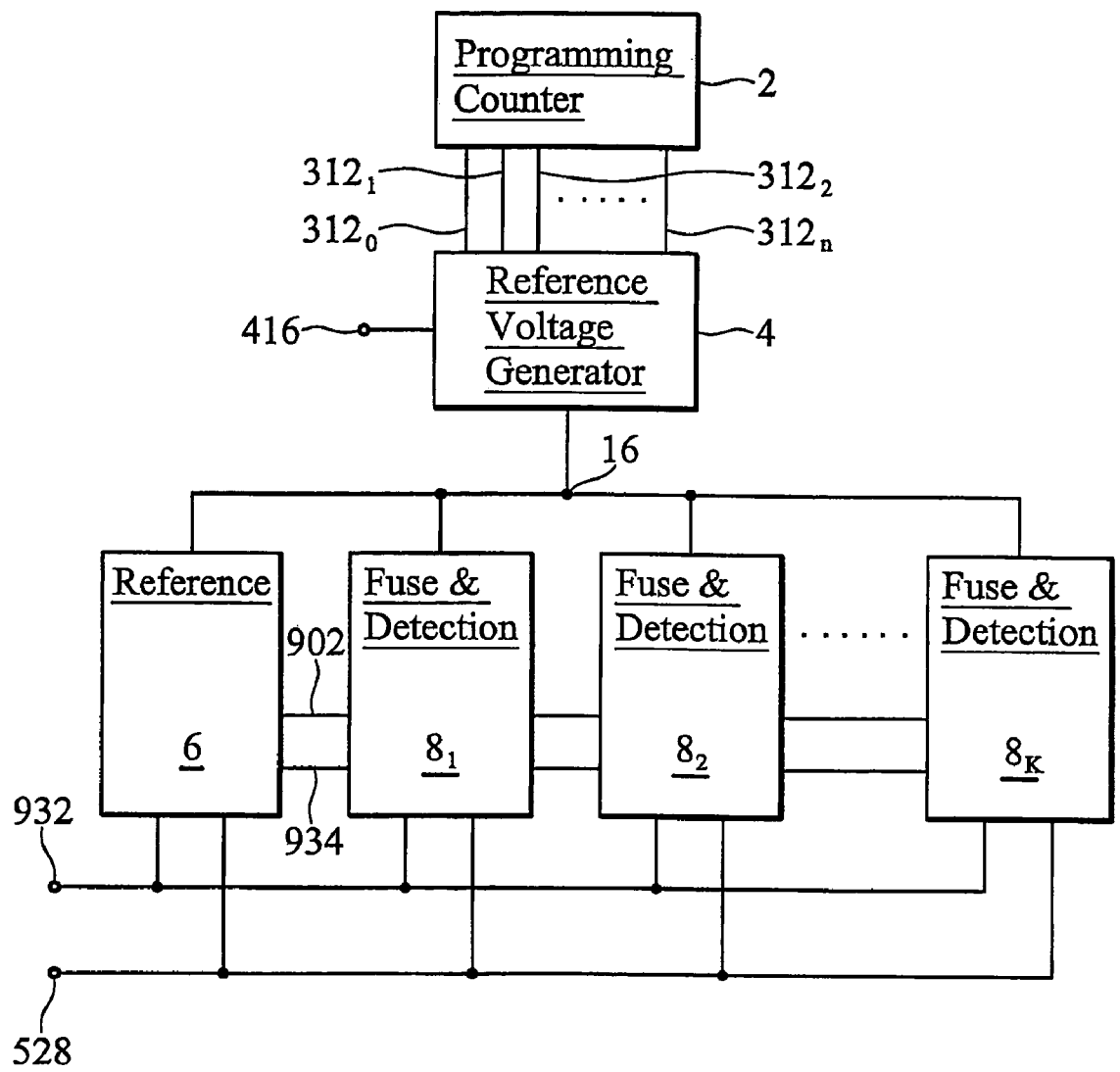
FIG. 2 is a block diagram of the preferred embodiment.

A preferred embodiment is illustrated in FIGS. 2 through 10. Throughout these figures, like elements are designated by identical reference numerals. FIG. 2 illustrates a block diagram of the preferred embodiment. A brief summary of the components is provided and more details are provided in the discussions of each component.

The circuit in FIG. 2 has four major components. A programming counter 2 is used to count how many times the fuses have been programmed; a blowing reference voltage generator 4 generates a blowing reference voltage $V_{BRF}$ which is used to determine whether the target resistance has been reached or not; an electrical fuse reference component 6 is used to determine the state of each fuse; and series of electrical fuse programming and detection circuits $8_1$ through $8_k$ contain a programmable fuse, a programming control circuit and a fuse state detection circuit.

Blowing reference enable signal 416 is used to turn on or off the blowing reference voltage VBRF. Fuse detection enable 932, or FDEN is used to turn off the detection circuit when the fuse is being programmed and turn it on when it is not. Programming control 528, or PROG is used to turn on and off programming circuit.

Figure 3:
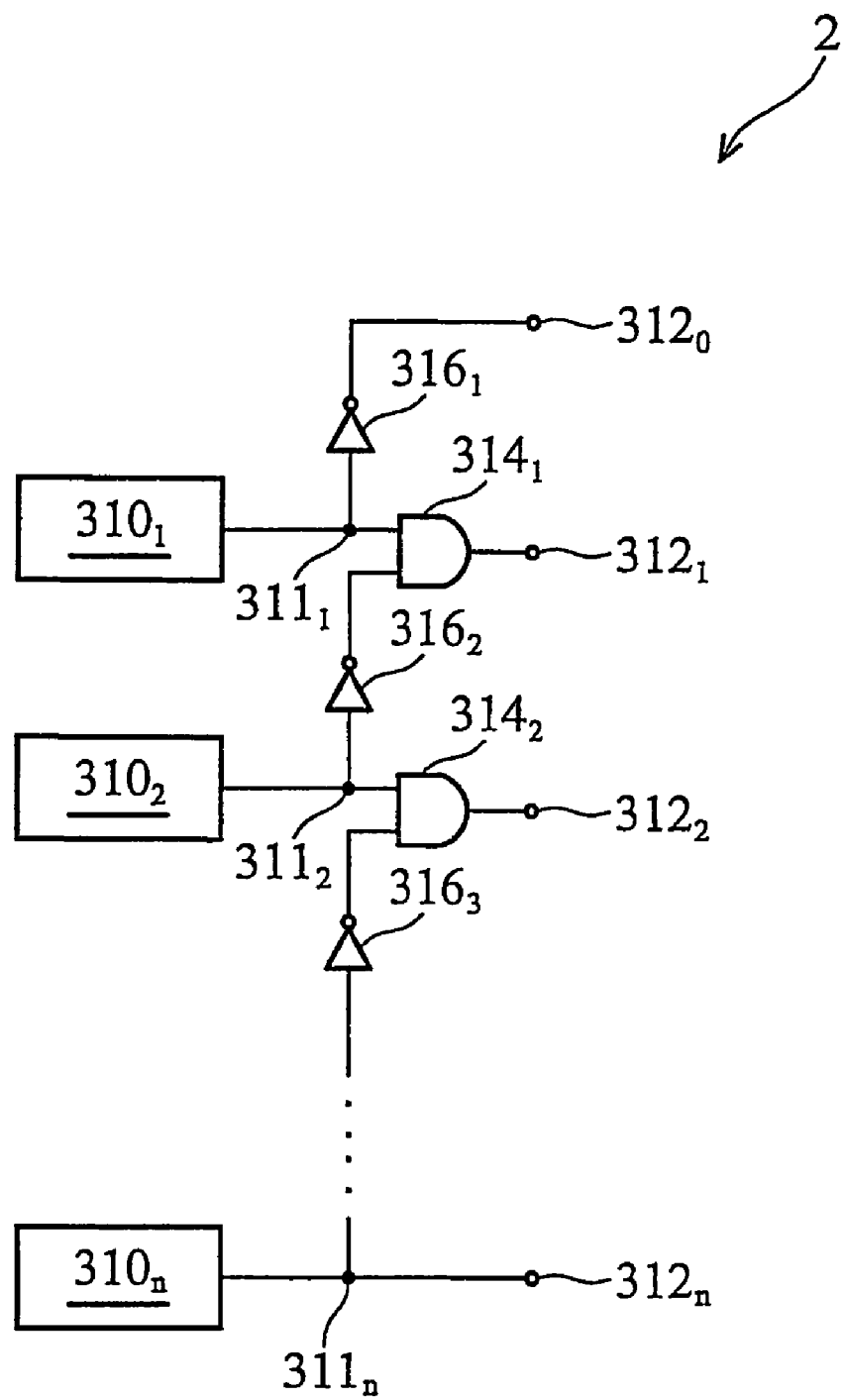
FIG. 3 is a block diagram of the programming counter.

FIG. 3 illustrates a programming counter 2. A sequenced list of recording fuses is denoted as fuses $310_1$ through fuse $310_n$ wherein the subscripts are the sequence numbers. Their function is to record the programming count permanently. The counter counts the programming by blowing $310_1$ through fuse $310_n$ in sequence. When fuse $310_1$ is programmed, the count is 1. Then $310_2$ is programmed, and the count is 2, etc. The count is not lost even when the circuit is powered off since fuses are used for recording count. The recording fuse can be any fuse that is programmable.

Nodes $312_0$ through $312_n$ are connected to switches and are used to control the setting of the blowing reference voltage $V_{BRF}$. The use of inverters 316 and AND gates 314 insures that if the record fuses are blown in sequence, then only the AND gate directly connected to the recording fuse being programmed outputs a "1", all other gates output "0"s.

In initial state, all record fuses are not programmed. Their outputs $311_1$ through $311_n$ are all "0"s. All inverters output "1"s, and all outputs of the "AND" gates are "0"s. Only node $312_0$ is in "1" state. When fuse $310_1$ is programmed, node $311_1$ is in "1" state, so node $312_1$ is in "1" state and all other $312$ nodes are in "0" states. After all programming related to programming count 1 is finished, fuse $310_2$ is programmed so that node $311_2$ state becomes "1", and node $312_2$ outputs a "1". The state of node $311_1$ is changed back "0" since the inverter $316_2$ output a "0" to AND gate $314_1$. States at nodes $312_3$ through $312_n$ remain "0"s. Therefore, only node $312_2$ is in "1" state. As the programming continues, nodes 312 are turned on one by one, and each 312 signal turn the previous one to "0".

Figure 4:
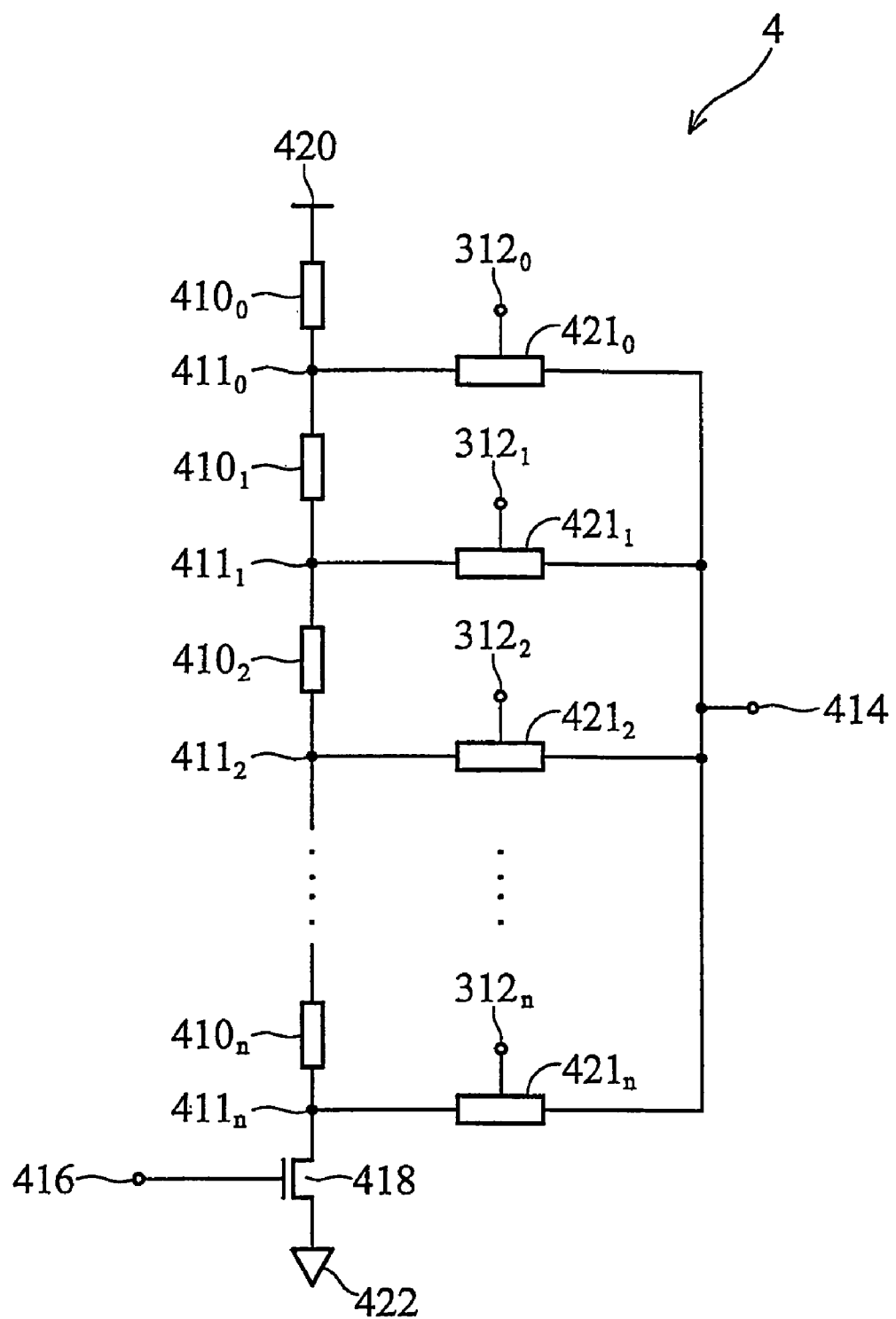
FIG. 4 is a schematic diagram of the blowing reference voltage generator.

Signals at nodes $312_1$ through $312_n$ are used to control the generating of a blowing reference voltage $V_{BRF}$, which in turn is used to program a fuse to one of the reference resistances. FIG. 4 illustrates a circuit schematic diagram of a blowing reference voltage generator. Node 420 is coupled to a high voltage power source, which is typically 2.5V or 3.3V. This power supply voltage is higher than the normal core circuit voltage, which is typically about 1.0V to 1.5V. Devices $410_0$ through $410_n$ are a series of impedances such as MOS devices, diodes, resistors etc. They are used to divide the power supply to a series of voltages $V_{D0}$, $V_{D1}$, $V_{D2}$ . . . $V_{Dn}$ at nodes $411_0$ through $411_n$. The values of impedances $Z_0$ through $Z_n$ are chosen to follow:

$$(Z_j + Z_{(j+1)} + \ldots + Z_{(n-1)} + Z_n)/(Z_{(j+1)} + \ldots + Z_{(n-1)} + Z_n) = R_{ref(j+1)}/R_{refj} \qquad [\text{Eq. 1}]$$

wherein $Z_j$ is the impedance of device $410_j$.

Switch control signals $312_0$ through $312_n$ (generated by the programming counter as shown in FIG. 3) are used to control the switches $421_0$ through $421_n$. As previously mentioned, only one of the switch control signals is "1", so only one switch $421_i$ is turned on and the corresponding voltage $V_{Di}$ is set as blowing reference voltage $V_{BRF}$. Transistor 418 is used to control the voltage generator circuit "on" or "off". Node 416 is connected to a blowing voltage enabling signal. If enable signal 416 is "1", transistor 418 is turned on, and the voltage generator circuit set $V_{BRF}$ to a desired blowing reference voltage. If enable signal 416 is "0", transistor 418 is turned off and $V_{BRF}$ is set to the power source voltage.

Figure 5:
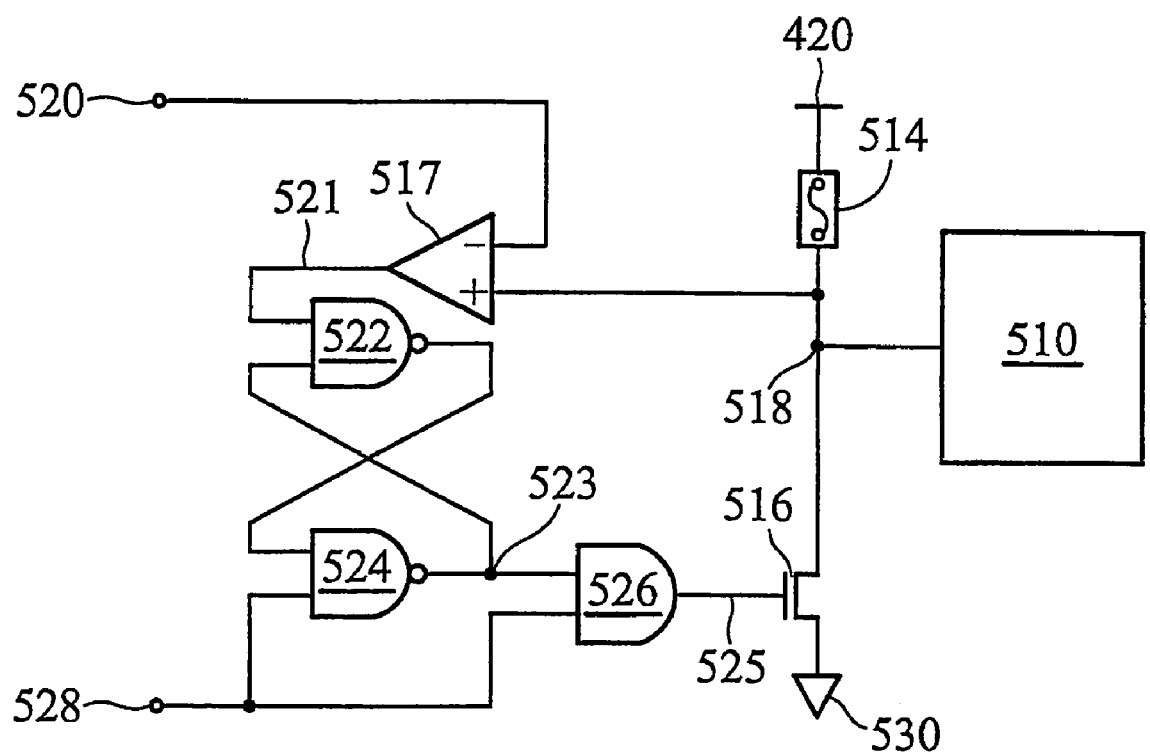
FIG. 5 is a circuit schematic diagram of an nMOS self-controlled programmable circuit.

Each of the electrical fuse programming and detection circuits $8_1$ through $8_k$ contains two parts, a self-controlled programmable fuse and a fuse state detection circuit. The preferred embodiment of the nMOS self controlled programmable fuse is shown in FIG. 5. Node 420 is connected to the high voltage power source at 2.5V or 3.3V. Transistor 516 is used to conduct a sufficient large current. When the programming enabling signal 528 is "0", transistor 516 is turned off and no current flows through fuse 514. When signal 528 becomes "1", transistor 516 is turned on, and the fuse is programmed. The current generates a voltage drop on the fuse 516 based on the ohm rule, $R_{fuse}=V_{fuse}/I_{fuse}$, wherein the $R_{fuse}$ is the resistance of the fuse 516, $V_{fuse}$ is the voltage applied on the fuse and $I_{fuse}$ is the current flowing through fuse. Before programming, the resistance of the fuse is low so that voltage $V_{518}$ at node 518 is higher than $V_{BRF}$ at node 520. Therefore, the voltage comparator 517 outputs a "1". When the signal 528 goes to high, programming starts, the fuse resistance increases with time so that the voltage $V_{518}$ decreases with time. When the voltage $V_{518}$ drops to lower than $V_{BRF}$, the comparator 517 outputs a low at node 521, this in turn changes the state of the latch composed of NAND gates 522 and 524. The AND gate 526 outputs a low pulse at node 525 so that transistor 516 is turned off and the programming is stopped. The latch keeps the states of the circuit stable even signal 528 changes to "0".

Figure 6:
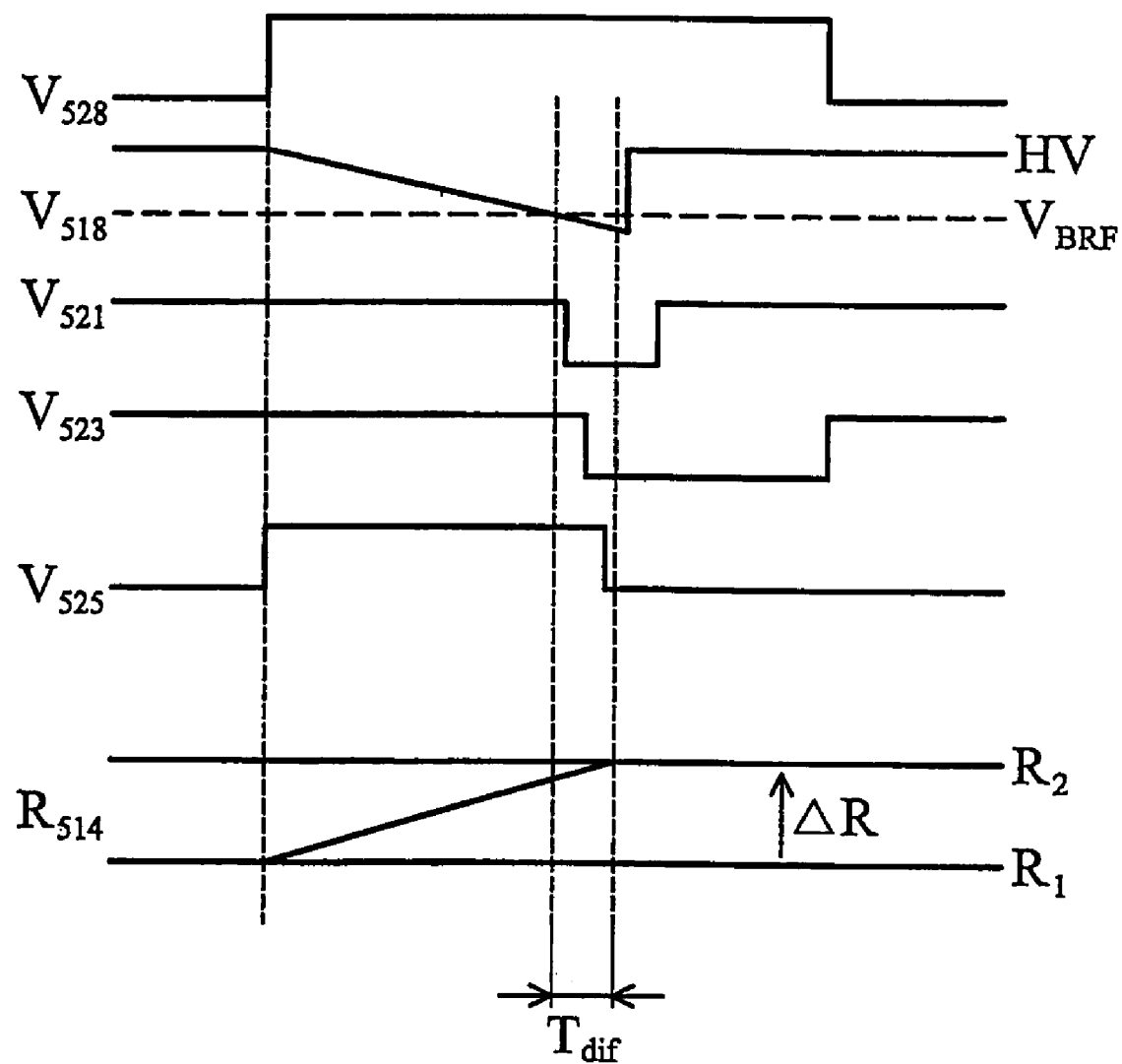
FIG. 6 is a sequence diagram of one programming process conducted by the nMOS self-controlled programmable circuit.

FIG. 6 illustrates the time sequences for one programming. The voltages and fuse resistance shown in FIG. 5 as the function of time. The graphs indicate how the voltages change with time at the nodes 518, 521, 523, 525, and 528. $R_{514}$ is the resistance of fuse 514, $R_1$ is the resistance of the fuse 514 before programming, and $R_2$ is the resistance after programming. The signal at node 528 triggers the increase of the fuse resistance $R_{514}$. When the voltage at node 518 $V_{518}$ is below $V_{BRF}$, the gate voltage $V_{525}$ changes to low so that the programming stops. It is to be noted that there is a lagging between the time at which $V_{518}$ reaches $V_{BRF}$ and the time at which $V_{525}$ becomes low (the programming stops). This time difference $T_{dif}$ is the circuit response time. Typically, the response time is in the magnitude of nanoseconds.

The programming current is controlled by transistor 516, the size of the transistor 516 is such required that the programming procedure is controllable, fast enough but still allows the fuse programming circuit to react if the fuse resistance has reached the target. Experiments have revealed that when programming current is in a preferred range of about 5 mA to about 40 mA, the programming time is around milliseconds to tens of milliseconds. Therefore, the response time of the self controlled programmable fuse that is much shorter then the programming time, ensures that the fuse resistance can be set to the target resistance substantially accurately.

Figure 7:
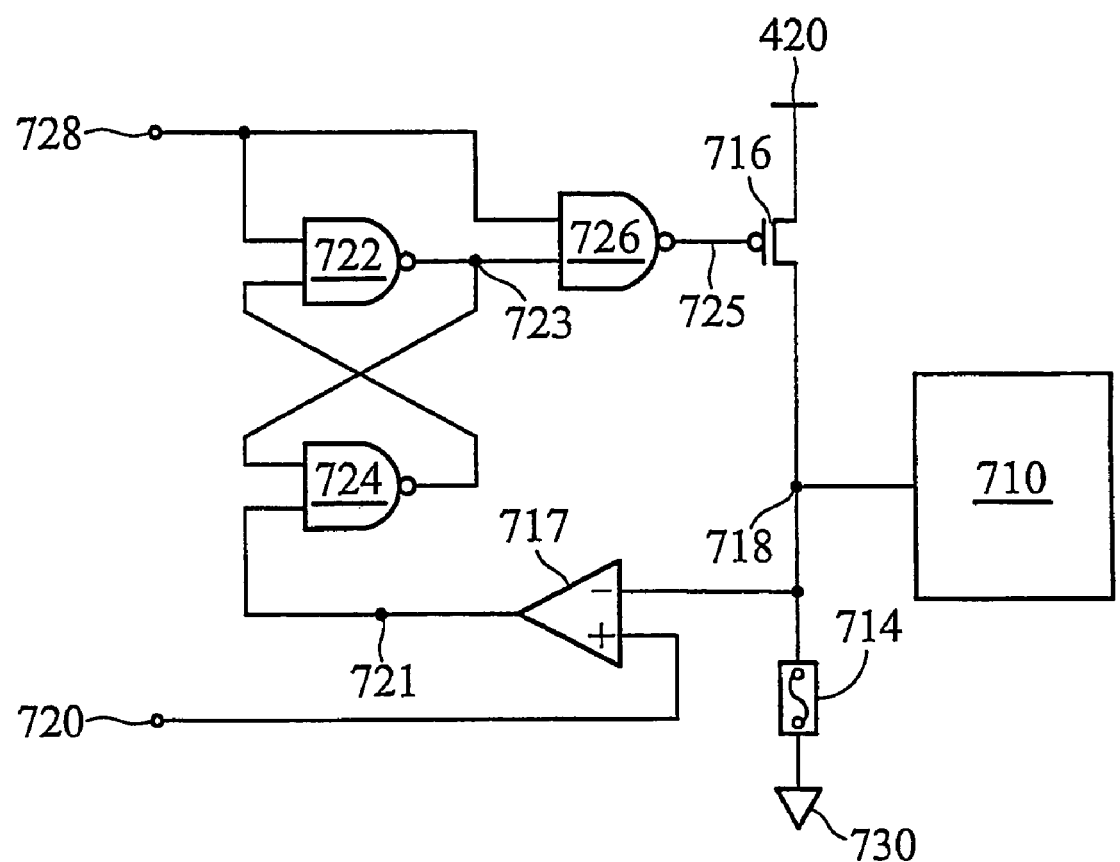
FIG. 7 is a circuit schematic diagram of a pMOS self-controlled programmable circuit.
Figure 8:
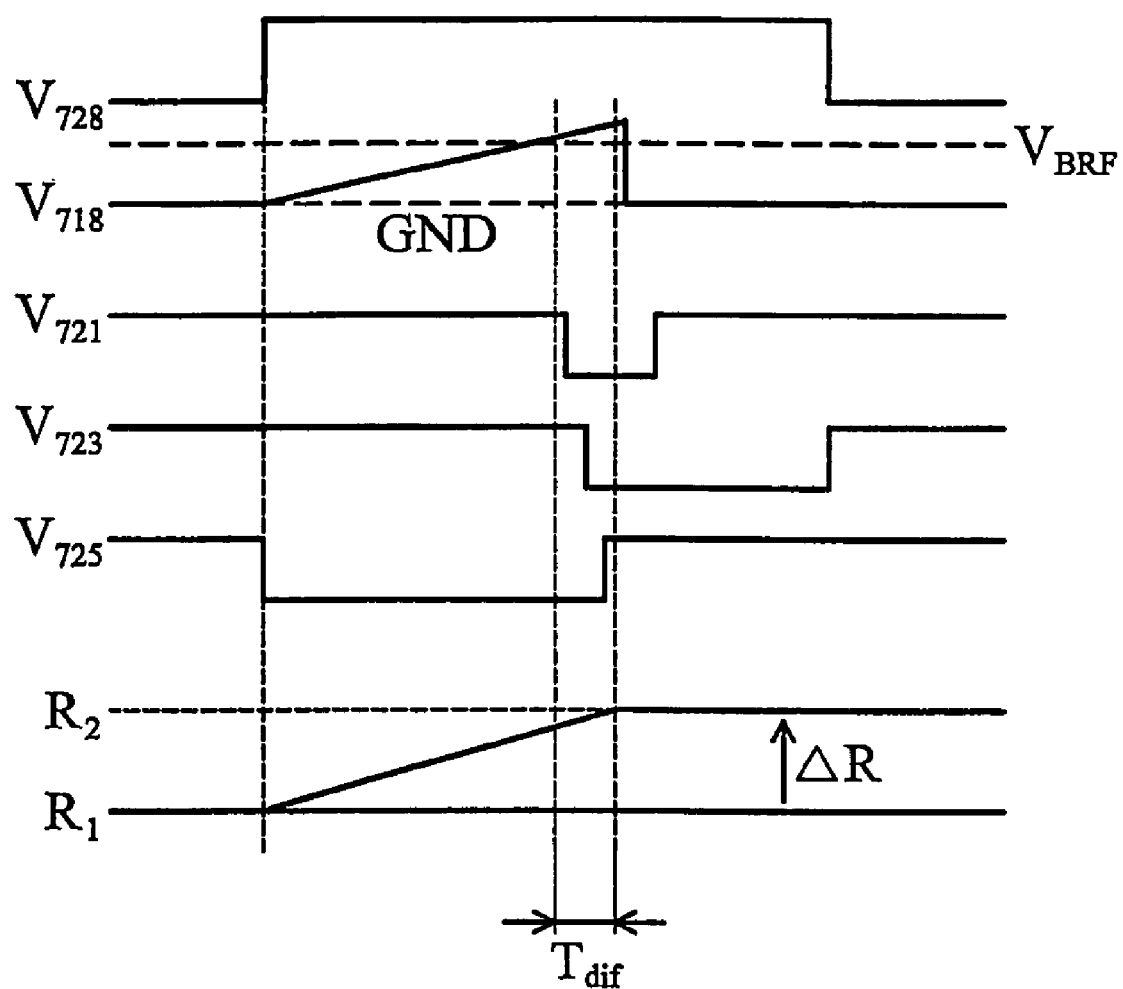
FIG. 8 is a sequence diagram of one programming process conducted by the pMOS self-controlled programmable circuit.

FIG. 7 illustrates another embodiment of the self-controlled programmable fuse. It is similar to FIG. 5 except that a pMOS transistor 716 replaces NMOS transistor 516 and an NAND gate 726 replaces AND gate 526. A latch is composed of NAND gates 722 and 724. Node 728 is a programming enable signal. When this node is set to high, the pMOS transistor 716 conducts and the resistance of the fuse 714 increases. When the voltage $V_{718}$ at node 718 increases to higher than the blowing reference voltage $V_{BRF}$ at node 720, the voltage comparator 717 outputs a "0" and the latch changes state, so that NAND gate 726 outputs a high to turn off the transistor 716, and the programming stops. FIG. 8 illustrates the time sequences of the pMOS self-controlled programmable fuse.

Figure 9:
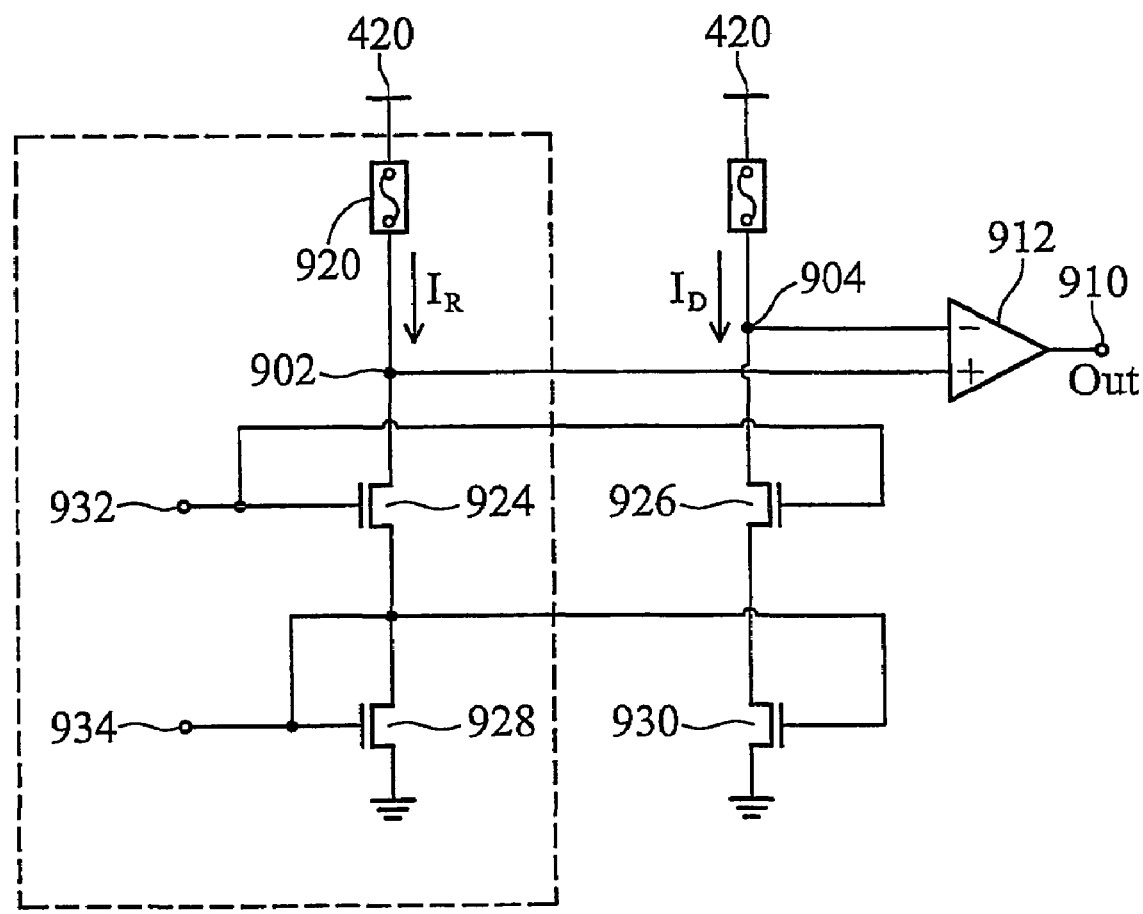
FIG. 9 is a circuit schematic diagram of a state detection circuit.

FIG. 9 illustrates a circuit schematic diagram of the fuse state detection circuit. This circuit comprises a fuse detection reference generator, which has a reference fuse 920 and two transistors 924 and 928, and a target fuse voltage generator, which has a to-be-detected fuse (or target fuse) 514 and transistors 926 and 930. Transistors 924 and 926 turn on the detection circuit if state detection is desired and turn off the detection circuit if programming is desired. Device 912 is a voltage comparator. The state is generated by comparing voltage $V_{902}$ at node 902 and voltage $V_{904}$ at node 904. If $V_{902}>V_{904}$, Output voltage $V_{out}$ at node 910 is "1", if $V_{902}<V_{904}$, $V_{out}$ is "0".

Assume when detection begins, the reference fuse 920 has finished its (j+1)th programming so that the reference fuse 920 has a resistance $R_{ref(j+1)}$. The target fuse's resistance is $R_{refj}$ before programming, and $R_{ref(j+1)}$ after programming, and $R_{refj}<R_{ref(j+1)}$. It is to be noted that the fuse state is only determined using the current resistance of the reference fuse 920. If the program counter increases and the reference fuse 920 is programmed to a higher resistance, $V_{out}$ will become "0" until the target fuse is programmed again.

In the case that the reference fuse 920 and the target fuse 514 have the same resistances, also the current flowing through two fuses are the same so that $V_{902}$ and $V_{904}$ are the same, the comparator 912 is in an uncertain state and the detection error occurs. The design of the detection circuit requires that the $V_{out}$ is safely in "0" state when the resistance of fuse 514 equals $R_{refj}$, and safely in "1" state when the resistance of fuse 514 equals $R_{ref(j+1)}$. Therefore, it is expected that the best point for comparator 912 to change state is at the middle of $R_{refj}$ and $R_{ref(j+1)}$ so that there is adequate error margin for the comparator 912. Therefore, it is desired that:

$$V_{902}=(V_{refj}+V_{ref(j+1)})/2 \qquad [\text{Eq. 2}]$$

and:

$$V_{ref(j+1)}<V_{902}<V_{refj} \qquad [\text{Eq. 3}]$$

Since the reference fuse 920 has already finished its (j+1)th programming, $V_{902}$ equals $V_{ref(j+1)}$, it is derived that:

$$V_{902}=R_{ref(j+1)}*I_R=(R_{ref(j+1)}+R_{refj})*I_D/2 \qquad [\text{Eq. 4}]$$

wherein $I_R$ is the current flowing through reference fuse 920 and $I_D$ is the current flowing through the target fuse 514. Divide both sides by $R_{ref(j+1)}$, we have:

$$I_R=\frac{1}{2}(1+R_{refj}/R_{ref(j+1)})*I_D \qquad [\text{Eq. 5}]$$

due to $R_{refj}<R_{ref(j+1)}$, the state detection circuit should be such designed that:

$$I_R<I_D \qquad [\text{Eq. 6}]$$

for example:

if $R_{refj}=0.8R_{ref(j+1)}$ then $I_R=0.9*I_D$ if $R_{refj}=0.6R_{ref(j+1)}$ then $I_R=0.8*I_D$ if $R_{refj}=0.4R_{ref(j+1)}$ then $I_R=0.7*I_D$ Therefore, by setting the ratio of the reference fuse current and the programmable fuse current, the comparator 717 can change states with adequate error margins.

The ratio of the two currents $I_R$ and $I_D$ is roughly determined by the transistors 928 and 930 and resistances of fuses 920 and 514. In FIG. 9, the transistors 928 and 930 have their gates connected to the same voltage $V_{NBIAS}$ at node 934. The gate and drain of transistor 928 are connected, so transistor 928 is biased in its saturation region as long as $V_{NBIAS}$ is higher than its threshold voltage. In the saturation region, the drain-source current of a transistor is roughly proportional to W/L where W is the transistor gate width and L is the transistor gate length.

Therefore, $$(W/L)_{928}/(W/L)_{930} \sim \frac{1}{2}(1+R_{ref}/R_{ref(j+1)}) \quad [\text{Eq. 7}]$$

wherein $(W/L)_{928}$ is the gate width-length ratio of the transistor 928 and $(W/L)_{930}$ is the gate width-length ratio of the transistor 930. From equation 7, it is found that the equation 5 can be satisfied by setting the $(W/L)_{928}$ value smaller than the $(W/L)_{930}$ value.

Figure 10:
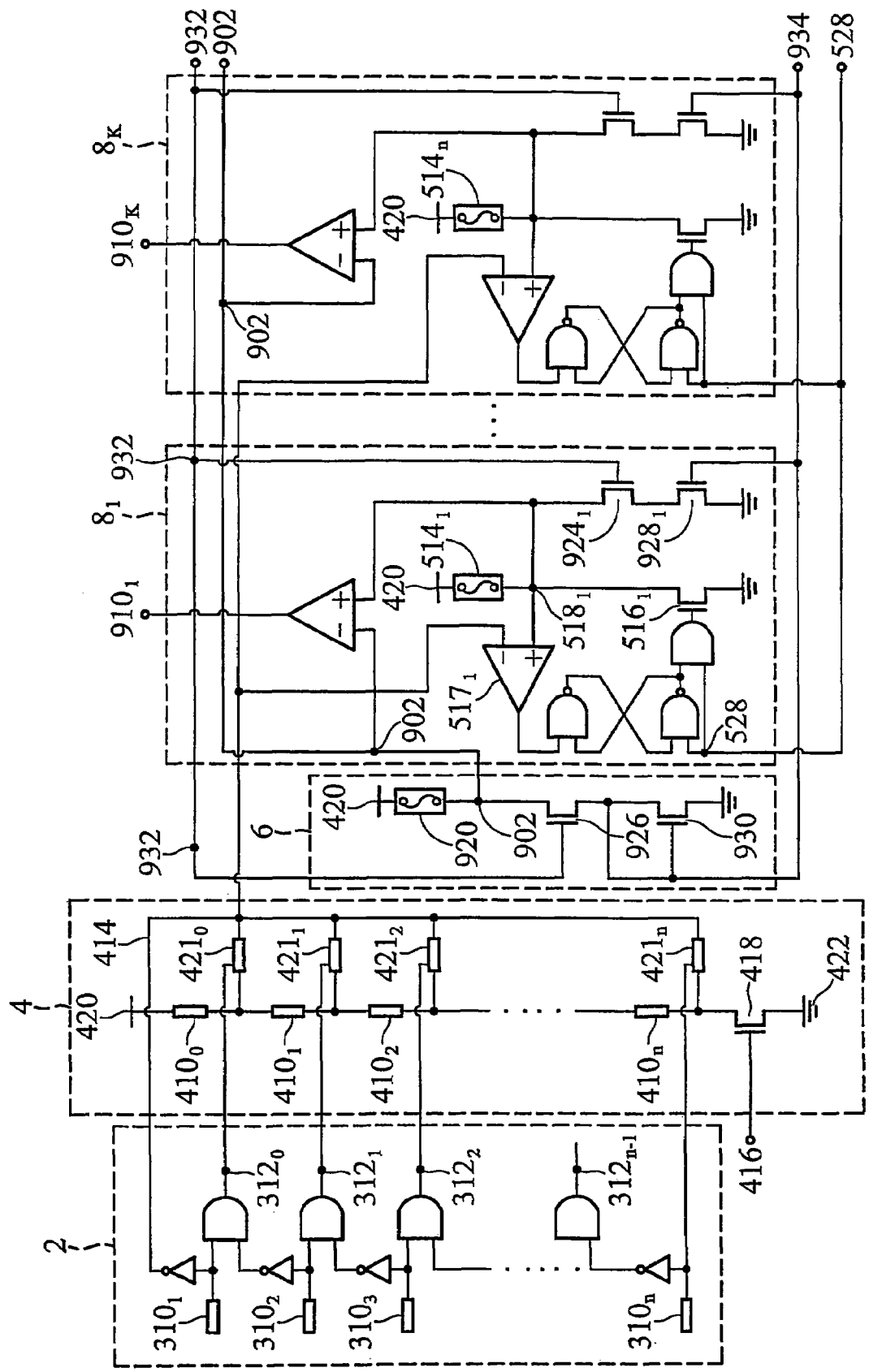
FIG. 10 is a combined circuit schematic diagram of the preferred embodiment.

To help the understanding of how the preferred embodiment of the present invention works, the circuit diagram in FIG. 2 is illustrated as a circuit schematic diagram in FIG. 10. FIG. 10 provides an integrated circuit of FIG. 3 through FIG. 9. It is to be appreciated that FIG. 10 is only used to show how the previously discussed components work together, and circuit shown in FIG. 10 is not necessarily a real circuit of the preferred embodiment. The numbers in FIG. 10 are the same as what are in FIG. 3 through FIG. 9 so it is easier to understand how pieces fit to each other. Blocks shown in FIG. 2 are enclosed in dashed lines.

Circuit 2 is the programming counter. It has n fuses $310_1$ through $310_n$, each programmable fuse can be programmed up to n times. Circuit 4 is the blowing reference voltage generator. When fuses $310_1$ through $310_n$ are programmed one by one, a lower and lower blowing reference voltage $V_{BRF}$ is generated at node 414. This blowing reference voltage $V_{BRF}$ is used by the reference fuse circuit 6 and fuse programming and detection circuit $8_1$ through $8_k$.

The circuit 6 is the reference fuse circuit. When programming starts at count 1, the programming counter fuse $310_1$ is blown and a blowing reference voltage $V_{BRF1}$ is generated at node 414, the detection enable voltage at node 932 $V_{932}$ is set to low, the transistors 924 and 926 are turned off so that detection circuit is turned off. The reference fuse 920 is programmed to resistance $R_{ref1}$.

The programming circuit of the reference fuse (not shown) is similar to the programming circuit in circuit $8_1$. Programmed reference fuse generates a reference voltage $V_{902}$ at node 902, and $V_{902}$ is used to determine the state of the programmable fuses in circuit $8_1$ through $8_k$. At the moment, if the detection enable signal $V_{932}$ is set to high to turn on the detection circuits, the nodes $910_1$ through $910_k$ all output "0".

Circuits $8_1$ through $8_k$ are a series of programming and detection circuits. If the application requires fuses to be programmed, the node 528 voltage $V_{PROG}$ is set to high, so circuit $8_1$ starts programming fuse $514_1$. Since the same blowing reference voltage is used, the fuse $514_i$ will be programmed to the same resistance as the reference fuse 920 before the circuit $8_i$ automatically shuts down itself. The fuses $514_2$ through $514_n$ are also programmed. After all fuses have been programmed, voltage at node 528 $V_{PROG}$ may be set to low. The detection enable voltage at node 932 is set to high to turn on transistors 924 and 926 so that detection circuit starts working. Detection circuits output "1" at nodes $910_1$ through $910_k$.

The circuit can now start count 2 by programming fuse $310_2$. A blowing reference voltage $V_{BRF2}$ is generated at node 414, $V_{BRF2}$ is lower than $V_{BRF1}$, and the reference fuse 920 is programmed to a higher resistance $R_{ref2}$. At this time, if turned on, detection circuits output "0"s again. Then all programmable fuses in circuits $8_1$ through $8_k$ can also be programmed to resistance $R_{ref2}$. After programming is finished, the detection circuits output fuse states at nodes $910_1$ through $910_k$. The process goes on until the fuse $310_n$ and all programmable fuses 514 are programmed to $R_{refn}$.

In the preferred embodiment shown FIG. 2 and FIG. 10, circuits $8_1$ through $8_k$ share common fuse detection signal 932 and fuse programming enable signal 528. In other embodiments, each of the circuit $8_1$ through $8_k$ may have their own detection enable node and programming enable node so that each fuse can be programmed separately and each fuse has the option not to be programmed while other fuses are programmed.

To use the multiple programmable fuse, the reference fuse needs to be programmed regarding the first blowing reference voltage $V_{BRF1}$ for initialization, and those fuses desired to output state '1' also must be programmed regarding the same blowing reference voltage $V_{BRF1}$ to make the fuse resistance equal to the reference fuse resistance. For the other fuses desired to output state '0', the programming won't be triggered, so that the digit content of fuses can represent information such as a system setting. The information or the setting can be changed by just increasing the programming counter to establish the second blowing reference voltage $V_{BRF2}$ for second programming, then program the reference fuse and those fuses desired to output state '1'. Same procedure is repeated for next changes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multiple-time electrical fuse programming circuit comprising:
   a programming counter;
   a blowing reference voltage generator coupled to output nodes of the programming counter;
   at lease one self-controlled programmable fuse coupled to a reference node of the blowing reference voltage generator; and
   a fuse detection reference generator coupled to the blowing reference voltage generator.

2. The multiple-time electrical fuse programming circuit in claim 1 wherein the programming counter comprises:

a plurality of sub circuits each having an AND gate, an inverter and a fuse wherein;
the AND gate having a first input node, a second input node, and an output node;
the inverter having an input node and an output node;
the fuse having an output node coupled to the first input node of the AND gate and to the input node of the inverter and wherein the output node of the AND node is coupled to one the output nodes of the programming counter; and
wherein the plurality of sub circuits are coupled in series and wherein the output node of the inverter coupled to the second input node of the AND gate of the next sub circuit and wherein the plurality of sub circuits have an uncoupled inverter input and an uncoupled inverter output;
a fuse having an output node coupled to a last switch signal node and to the uncoupled inverter input node of the plurality of sub circuits; and
the uncoupled inverter output node of the plurality of sub circuits being coupled to a first switch signal node.

3. The multiple-time electrical fuse programming circuit in claim 1 wherein the fuse detection reference generator comprises:
a reference fuse having a first end coupled to a positive power supply node;
a first nMOS transistor having its drain coupled to the output node and its gate coupled to a fuse detection enable node;
a second NMOS transistor having its drain coupled to the source of the first transistor, its gate coupled to its drain and a bias voltage node, and its source coupled to a negative power supply node; and
the drain of the first nMOS transistor being coupled to a second end of the reference fuse.

4. The multiple-time electrical fuse programming circuit in claim 1 wherein the fuse detection reference generator comprises:
a reference fuse having a first end coupled to a negative power supply node;
a first pMOS transistor having its drain coupled to the output node and its gate coupled to a fuse detection enable node;
a second pMOS transistor having its drain coupled to the source of the first transistor, its gate coupled to its drain and a bias voltage node, and its source coupled to a positive power supply node; and
the drain of the first pMOS transistor being coupled to a second end of the reference fuse.

5. The multiple-time electrical fuse programming circuit in claim 1 wherein the blowing reference voltage generator comprises:
a blowing reference voltage node;
an MOS transistor;
a plurality of impedances coupled in series wherein the impedances having one end coupled to the MOS transistor and the other end coupled to a power supply node;
plurality of switches each having a first end coupled to one junction of impedances, a second end coupled to the blowing reference voltage node; and
a switch have a first end coupled to the drain of the transistor and a second end coupled to the blowing reference voltage node, and a switch control end coupled to the output node of the programming counter.

6. The multiple-time electrical fuse programming circuit in claim 5 wherein the MOS transistor is an nMOS transistor coupled between the plurality of impedances and the power supply node is a negative power supply node.

7. The multiple-time electrical fuse programming circuit in claim 5 wherein the MOS transistor is a pMOS transistor coupled between the plurality of impedances and the power supply node is a positive power supply node.

8. The multiple-time electrical fuse programming circuit in claim 5 wherein the impedances are selected from the group consisting of diodes, transistors and resistors.

9. The multiple-time electrical fuse programming circuit in claim 1 wherein the self-controlled programmable fuse comprises:
a programmable electrical fuse;
a fuse state detection circuit; and
a self-controlled programming circuit.

10. The multiple-time electrical fuse programming circuit in claim 9 wherein the fuse state detection circuit comprises:
a target fuse voltage generator having an output node; and
a comparator having its positive input coupled to an output node of the fuse detection reference generator and its negative input node coupled to the output node of the target fuse voltage generator.

11. The multiple-time electrical fuse programming circuit in claim 10 wherein the target fuse voltage generator comprises:
a first nMOS transistor having its drain coupled to the output node of the target fuse voltage generator and one end of the programming fuse, and its gate coupled to a fuse detection enable node; and
a second nMOS transistor having its drain coupled to the source of the first nMOS transistor, its gate coupled to a bias voltage node, and its source coupled to a negative power supply node.

12. The multiple-time electrical fuse programming circuit in claim 10 wherein the target fuse voltage generator comprises:
a first pMOS transistor having its drain coupled to the output node of the target fuse voltage generator and one end of the programming fuse, and its gate coupled to a fuse detection enable node; and
a second pMOS transistor having its drain coupled to the source of the first pMOS transistor, its gate coupled to a bias voltage node, and its source coupled to a positive voltage power supply node.

13. The multiple-time electrical fuse programming circuit in claim 10 wherein:
the fuse detection reference generator having a first current flow to a negative power supply node;
the target fuse voltage generator having a second current flow to the negative power supply node; and
the first current being smaller than the second current.

14. The multiple-time electrical fuse programming circuit in claim 10 wherein:
the fuse detection reference generator comprising a reference fuse having a first end coupled to a positive power supply node, a first nMOS transistor having its drain coupled to a second end of the reference fuse and the output node of the fuse detection reference generator, its gate coupled to a fuse detection enable node, a second nMOS transistor having its drain coupled to the source of the first transistor, its gate coupled to its drain and a bias voltage node, and its source coupled to a negative power supply node;
the target fuse voltage generator comprising a third NMOS transistor having its drain coupled to the output node, its gate coupled to the fuse detection enable node, a fourth nMOS transistor having its drain coupled to the source of the third transistor, its gate coupled to the bias voltage node, and its source coupled to the negative power supply node, and the drain of the third NMOS transistor is couple to output node of the target fuse voltage generator;

the second nMOS transistor having a first gate width-length ratio;

the fourth nMOS transistor having a second gate width-length ratio; and the first gate width-length ratio being smaller than the second gate width-length ratio.

15. The multiple-time electrical fuse programming circuit in claim 9 wherein the self-controlled programming circuit comprises:
   a programmable fuse;
   a voltage comparator;
   a latch; and
   a gate selected from the group consisting of NAND gate and AND gate.

16. The multiple-time electrical fuse programming circuit in claim 15 wherein the latch comprises a first NAND gate and a second NAND gate.

17. The multiple-time electrical fuse programming circuit in claim 9 wherein the self-controlled programming circuit comprises:
   a first node coupled to the programming fuse;
   an nMOS transistor having its drain coupled to the first node and its source coupled to a negative power supply;
   a comparator having its positive input node coupled to the first node, its negative input node coupled to a blowing reference voltage node;
   a first NAND gate having a first input node coupled to the output node of the comparator; a second NAND gate having a first input node coupled to the output node of the first NAND gate, a second input node coupled to a programming enable node, and an output node coupled to a second input node of the first NAND gate; and
   an AND node having a first input node coupled to the output of the second NAND gate, a second input node coupled to the programming enable node, and an output node coupled to the gate of the NMOS transistor.

18. The multiple-time electrical fuse programming circuit in claim 9 wherein the self control blowing circuit comprises:
   a first node coupled to the programming fuse;
   a pMOS transistor having its drain coupled to the first node and its source coupled to a power supply node;
   a comparator having its negative input node coupled to the first node, its positive input node coupled to a blowing reference voltage node;
   a first NAND gate having a first input node coupled to the output node of the comparator;
   a second NAND gate having a first input node coupled to the output node of the first NAND gate, a second input node coupled to a programming enable node, and an output node coupled to a second input node of the first NAND gate; and
   an third NAND gate having a first input node coupled to the output of the second NAND gate, a second input node coupled to the programming enable node, and an output node coupled to the gate of the pMOS transistor.

19. The multiple-time electrical fuse programming circuit in claim 9 wherein the programmable electrical fuse comprises poly-silicide fuse.

20. A method of implementing a multiple-time programming fuse, the method comprises:
   providing a counter;
   generating a first blowing reference voltage;
   programming a reference fuse using the first blowing reference voltage;
   programming a first programmable fuse using the first blowing reference voltage;
   incrementing the counter;
   generating a second blowing reference voltage;
   programming the reference fuse using the second blowing reference voltage; and
   programming the first programmable fuse using the second blowing reference voltage.

21. The method of claim 19 further comprising:
   generating a first state by comparing the first programmable fuse with the reference fuse after programming the reference fuse using the first blowing reference voltage;
   generating a second state by comparing the multiple fuse with the reference fuse after programming the first programmable fuse using the first blowing reference voltage;
   generating a third state by comparing the first programmable fuse with the reference fuse after programming the reference fuse using the second blowing reference voltage; and
   generating a fourth state by comparing the programmable fuse with the reference fuse after programming the first programmable fuse using the second blowing reference voltage.

22. The method of claim 19 further comprising:
   programming a plurality of second programmable fuses; and
   generating states by comparing each of the second programmable fuses with the reference fuse.

23. A multiple-time electrical fuse programming circuit comprising:
   means for counting the number of programming;
   means for generating blowing reference voltages coupled to the means for counting the number of programming;
   means for programming a reference fuse multiple times using the blowing reference voltages;
   means for programming a programmable fuse multiple times using the blowing reference voltages; and
   means for detecting states of the programmable fuse.

24. The multiple-time electrical fuse programming circuit of claim 23 wherein the means for counting the number of programming comprises multiple electrical fuses for recording the number of programming.

25. The multiple-time electrical fuse programming circuit of claim 23 wherein the means for generating blowing reference voltages comprises plurality of impedances for dividing a power supply voltage into the blowing reference voltages.

26. The multiple-time electrical fuse programming circuit of claim 23 wherein the means for programming a programmable fuse multiple times comprises a first comparator comparing the blowing reference voltages and a reference voltage generated by the means for programming a programmable fuse.

27. The multiple-time electrical fuse programming circuit of claim 23 wherein the means for detecting the states of the programmable fuse comprises a second comparator comparing the voltages generated by using the reference fuse and the programmable fuse.

* * * * *